(12) United States Patent
Chen et al.

(10) Patent No.: US 10,383,247 B2
(45) Date of Patent: *Aug. 13, 2019

(54) HIGH DENSITY CHASSIS FOR A SERVER RACK

(71) Applicant: Quanta Computer Inc., Taoyuan (TW)

(72) Inventors: Chao-Jung Chen, Taoyuan (TW);
Yaw-Tzorng Tsorng, Taoyuan (TW);
Chun Chang, Taoyuan (TW); Chen Tseng, Taoyuan (TW)

(73) Assignee: QUANTRA COMPUTER INC., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/144,352

(22) Filed: May 2, 2016

(65) Prior Publication Data

US 2016/0270250 A1     Sep. 15, 2016

Related U.S. Application Data

(63) Continuation-in-part of application No. 14/070,379, filed on Nov. 1, 2013, now Pat. No. 9,367,082.

(Continued)

(51) Int. Cl.
*G06F 1/18* (2006.01)
*H05K 7/14* (2006.01)
*G11B 33/12* (2006.01)

(52) U.S. Cl.
CPC ........... *H05K 7/1487* (2013.01); *G06F 1/187* (2013.01); *G11B 33/124* (2013.01); *G11B 33/128* (2013.01)

(58) Field of Classification Search
CPC ..... G06F 1/187; G11B 33/126; G11B 33/128; G11B 33/02

(Continued)

(56) References Cited

U.S. PATENT DOCUMENTS 4,370,007 A    1/1983  Fler
5,332,306 A *  7/1994  Babb ................... H05K 7/1418
                                               312/223.1

(Continued)

FOREIGN PATENT DOCUMENTS

CN    103593012 A    2/2014
CN    203630697 U    6/2014

(Continued)

OTHER PUBLICATIONS

Taiwanese Office Action for Application No. 105119424, dated Apr. 13, 2017, w/ First Office Action Summary.

(Continued)

*Primary Examiner* — Adrian S Wilson
(74) *Attorney, Agent, or Firm* — Nixon Peabody LLP; Zhou Lu

(57) ABSTRACT

A removable chassis for a server rack includes two side walls, an accommodation space, and a carrier tray. The two side walls are on either side of the removable chassis, where each side wall includes a slide rail for sliding the removable chassis into or out of the server rack. The accommodation space is defined between the two sidewalls. The accommodation space is divided into a plurality of compartments by a plurality of dividers. The carrier tray is slidably attached to each compartment and held in place by friction. The carrier tray includes at least one recess for each removably receiving an electronic device.

17 Claims, 13 Drawing Sheets

Related U.S. Application Data

(60) Provisional application No. 62/281,309, filed on Jan. 21, 2016.

(58) Field of Classification Search
USPC .......... 361/679.33, 724–727; 14/679.33, 14/724–727
See application file for complete search history.

(56) References Cited

U.S. PATENT DOCUMENTS

| | | | |
|---|---|---|---|
| 6,115,242 A * | 9/2000 | Lambrecht | G06F 1/183 257/686 |
| 6,351,374 B1 * | 2/2002 | Sherry | G06F 1/184 361/679.33 |
| 6,612,667 B2 | 9/2003 | Tsai et al. | |
| 6,741,467 B2 * | 5/2004 | Coglitore | G06F 1/18 174/377 |
| D532,418 S * | 11/2006 | Crisp | D14/313 |
| 7,138,733 B2 * | 11/2006 | Sanders | H05K 7/1492 307/147 |
| 7,362,565 B2 * | 4/2008 | Imblum | G06F 1/184 361/679.33 |
| 7,394,660 B2 * | 7/2008 | Hidaka | G11B 33/126 361/724 |
| 7,471,509 B1 * | 12/2008 | Oliver | G11B 25/043 312/223.2 |
| 7,542,295 B2 * | 6/2009 | Imsand | G06F 1/181 361/724 |
| 7,573,705 B2 * | 8/2009 | Alaimo | G06F 1/182 361/679.33 |
| D608,776 S * | 1/2010 | Kang | D14/301 |
| 7,768,787 B2 * | 8/2010 | Vaughan | H05K 7/1487 361/679.33 |
| 7,864,519 B2 * | 1/2011 | Lin | G11B 33/128 361/679.33 |
| 8,264,832 B2 * | 9/2012 | Sun | G11B 33/122 361/679.33 |
| 8,549,912 B2 * | 10/2013 | Merrow | G06F 1/187 369/30.48 |
| 8,599,550 B2 * | 12/2013 | Davis | G11B 33/128 361/679.33 |
| 8,964,371 B2 * | 2/2015 | Hou | G11B 33/02 312/223.2 |
| 9,367,082 B2 * | 6/2016 | Jau | G06F 1/16 |
| 9,395,767 B2 * | 7/2016 | McCabe | G06F 1/187 |
| 2002/0144044 A1 * | 10/2002 | Moon | G06F 3/0607 710/302 |
| 2003/0043550 A1 * | 3/2003 | Ives | G06F 1/184 361/726 |
| 2003/0102785 A1 * | 6/2003 | Tsai | G06F 1/184 312/223.1 |
| 2004/0012921 A1 | 1/2004 | Hidaka et al. | |
| 2005/0219810 A1 * | 10/2005 | Carlson | G11B 33/128 361/679.32 |
| 2005/0219826 A1 * | 10/2005 | Carlson | G11B 33/128 361/724 |
| 2005/0257232 A1 * | 11/2005 | Hidaka | G11B 33/126 720/654 |
| 2006/0012950 A1 * | 1/2006 | Shih | G06F 1/184 361/679.33 |
| 2006/0050487 A1 * | 3/2006 | Wu | G06F 1/184 361/724 |
| 2006/0133030 A1 * | 6/2006 | Takahashi | G06F 1/184 361/679.36 |
| 2007/0127204 A1 * | 6/2007 | Muenzer | G06F 1/181 361/679.58 |
| 2007/0230109 A1 * | 10/2007 | Starr | G11B 33/128 361/679.31 |
| 2008/0013272 A1 * | 1/2008 | Bailey | G06F 1/187 361/679.33 |
| 2008/0037209 A1 * | 2/2008 | Niazi | G06F 1/181 361/727 |
| 2008/0239650 A1 * | 10/2008 | Fujie | G06F 1/187 361/679.35 |
| 2009/0167124 A1 * | 7/2009 | Lee | G06F 1/187 312/223.2 |
| 2009/0257187 A1 * | 10/2009 | Mills | H05K 7/20727 361/679.33 |
| 2009/0302727 A1 * | 12/2009 | Vincent | H05K 7/1488 312/326 |
| 2012/0036322 A1 * | 2/2012 | Klein | G06F 1/187 711/114 |
| 2013/0342990 A1 * | 12/2013 | Jau | G06F 1/18 361/679.39 |
| 2014/0021836 A1 * | 1/2014 | Hou | G11B 33/02 312/223.2 |

FOREIGN PATENT DOCUMENTS

| | | |
|---|---|---|
| TW | 504123 U | 9/2002 |
| TW | 572316 U | 1/2004 |
| TW | 201316182 A1 | 4/2013 |
| TW | M456068 U | 6/2013 |

OTHER PUBLICATIONS

Taiwanese Search Report for Application No. 105119424, dated Apr. 13, 2017.
Chinese Second Office Action for Application No. 201310218855.7, dated May 11, 2017, w/ Second Office Action Summary.
CN Office Action for Application No. 201610602179.7, dated Jul. 6, 2018, w/ Office Action Summary.
CN Search Report for Application No. 201610602179.7, mailed with First Office Action dated Jul. 6, 2018.

\* cited by examiner

HIGH DENSITY CHASSIS FOR A SERVER RACK

CROSS-REFERENCE TO RELATED APPLICATION

This application claims priority to and the benefit of U.S. Provisional Patent Application No. 62/281,309 filed on Jan. 21, 2016. This application is also a continuation-in-part of U.S. patent application Ser. No. 14/070,379, filed on Nov. 1, 2013. The contents of both of these applications are hereby incorporated by reference in their entirety as if fully set forth herein.

BACKGROUND

Field

This application relates to server systems, and more particularly to a high density chassis for a server rack.

Background

Servers are typically arranged in one or more server racks. Each server rack can hold multiple pieces of rack-mountable units that are designed to fit in the server rack. Each rack-mountable unit is generally one of several standard dimensions measured in terms or a 'rack unit.' A rack unit, U or RU is a unit of measure used to describe the height of equipment intended for mounting in a 19-inch rack or a 23-inch rack. The 19-inch (48.26 cm) or 23-inch (58.42 cm) dimension refers to the width of the equipment-mounting frame in the rack, i.e., the width of the equipment that can be mounted inside the rack. A one rack unit (1U) is 1.75 inches (44.45 mm) high. The size of a piece of rack-mounted equipment is frequently described as a number in "U". For example, a one rack unit is often referred to as "1U", 2 rack units as "2U" and so on. Typical dimensions for a 1U unit are about 19 inches width (e.g., between 423 millimeters and 453 millimeters wide)×1.75 inches height (e.g., between 42 millimeters and 46 millimeters in height)×17.7 inches-21.5 inches depth.

Because the dimensions of a 1U rack-mountable chassis are fixed, the physical size of the hard-drives and the limitation of the storage capacity of each hard drive limit the total storage capacity in a traditional 1U chassis. The typical 19-inch 1U storage chassis can only fit ten storage devices of the 2.5 in width standard.

SUMMARY

The following presents a simplified summary of one or more embodiments in order to provide a basic understanding of present technology. This summary is not an extensive overview of all contemplated embodiments of the present technology, and is intended to neither identify key or critical elements of all examples nor delineate the scope of any or all aspects of the present technology. Its sole purpose is to present some concepts of one or more examples in a simplified form as a prelude to the more detailed description that is presented later.

In some implementations, a removable chassis for a server rack includes two side walls, an accommodation space, and a carrier tray. The two side walls are on either side of the removable chassis, where each side wall includes a slide rail for sliding the removable chassis into or out of the server rack. The accommodation space is defined between the two sidewalls. The accommodation space is divided into a plurality of compartments by a plurality of dividers. The carrier tray is slidably attached to each compartment and held in place by friction. The carrier tray includes at least one recess for each removably receiving an electronic device.

In some implementations, the carrier tray includes a handle for pulling the carrier tray out of the compartment and a front panel including connectors for the electronic device.

In some implementations, the plurality of dividers includes five vertical dividers and a horizontal divider for dividing the accommodation space into twelve compartments. In some implementations, each of the plurality of compartments is substantially equivalent in dimensions.

In some implementations, the removable chassis is of a 438 millimeters wide standard. In some implementations, the removable chassis is of a 1U height standard. In some implementations, the electronic device is of a 2.5 inch wide standard storage drive.

In some implementations, a method for mounting an electronic device in a server rack includes sliding a carrier tray outward from a removable chassis of the server rack, to an open position, where the removable chassis includes: 1) two side walls on either side of the removable chassis, wherein each side wall comprises a slide rail for sliding the removable chassis into or out of the server rack and 2) an accommodation space defined between the two sidewalls, the accommodation space divided into a plurality of compartments by a plurality of dividers. The method includes inserting the electronic device into a recess of the carrier tray, where the carrier tray is slidably attached to one of the plurality of compartments and held in place by friction, and sliding the carrier tray inward into the removable chassis, to a closed position.

BRIEF DESCRIPTION OF THE DRAWINGS

These and other sample aspects of the present technology will be described in the detailed description and the appended claims that follow, and in the accompanying drawings, wherein:

DETAILED DESCRIPTION

The subject disclosure provides techniques for dynamic reconfiguration of peripheral bus switches. Various aspects of the present technology are described with reference to the drawings. In the following description, for purposes of explanation, numerous specific details are set forth in order to provide a thorough understanding of one or more aspects. It is evident, however, that the present technology can be practiced without these specific details. In other instances, well-known structures and devices are shown in block diagram form in order to facilitate describing these aspects.

The subject disclosure provides a high density chassis for a server rack that can fit more storage devices than a traditional 1U chassis. In some implementations, the high density chassis is able to fit two rows of six storage devices side-by-side instead of only five in a traditional 1U chassis. Thus, the high density chassis provides a twenty percent increase in storage capacity over the traditional 1U chassis.

Figure 1:
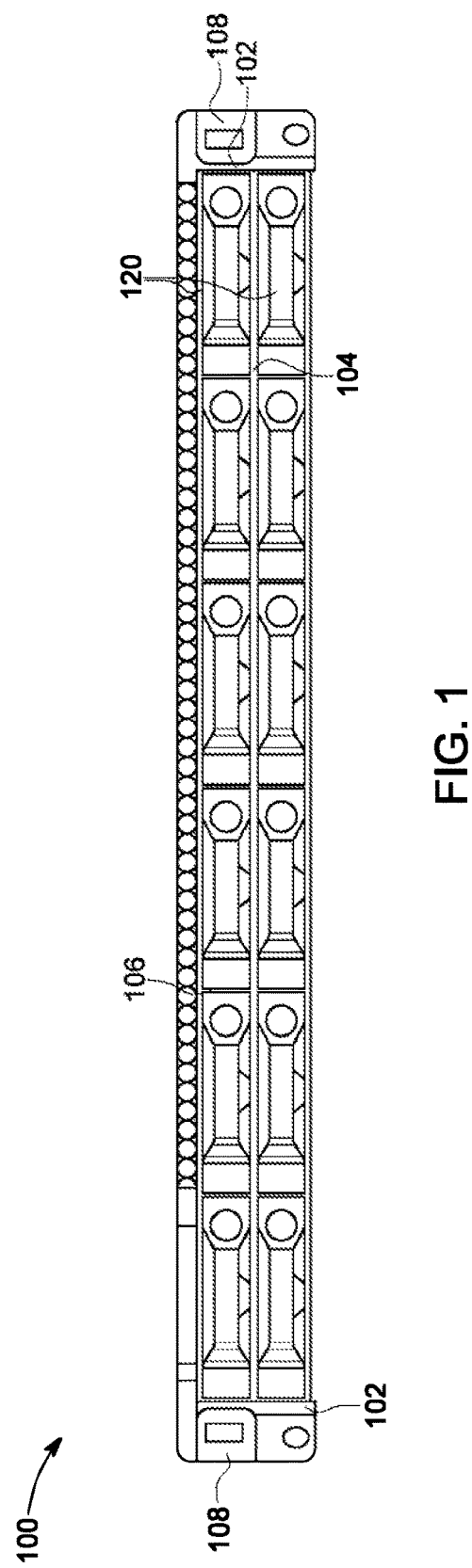
FIG. 1 illustrates a front side view of an example high density chassis for a server rack.

FIG. 1 illustrates a front side view of an example high density chassis 100 for a server rack. In some implementations, the chassis 100 is equivalent to a standard 19-inch 1U chassis in external dimensions. Thus, the chassis 100 is able to fit into server racks designed to hold standard 1U chassis. The chassis 100 has substantially rectangular dimensions of about 19 inches (approximately 438 mm) width×1.75 inches height×17.7 inches-21.5 inches depth. In some other implementations, the chassis is equivalent to a standard 2U chassis in external dimensions.

The chassis 100 is slidably mounted to the server rack (not shown). The chassis 100 includes a side wall 102 on either side of the chassis 100. For example, the side wall can be 1.75 inches in height and 17.7 inches-21.5 inches long. The chassis 100 includes a side rail 108 on each side wall 102 of the chassis 100. The side rails 108 allow the chassis 100 to side in or out of the server rack. The rails 108 can span the entire depth of the chassis 100 or a partial portion of the depth of the chassis 100.

An accommodation space is defined between the two side walls 102 for storing electronic devices such as storage drives. The accommodation space is divided into multiple compartments by a number of dividers. For example, the dividers can include a horizontal divider 104 and five vertical dividers 106 to divide the accommodation space into twelve compartments. In some implementations, each of the compartments are substantially equivalent in dimensions.

Each compartment includes a carrier tray 120. The carrier tray 120 is slidably attached to walls of the compartment by friction. The carrier tray 120 can be slid into or out of the compartment. The carrier tray 120 does not include side rails, which allows the carrier tray 120 to have a slimmer dimension than a typical carrier tray of a typical 1U chassis. Side rails of a typical chassis take up a non-insignificant amount of width on typical carrier tray. By relying on friction against the walls of the compartment to allow slidably attachment, the carrier tray 120 eliminates the need for side rails and is therefore narrower than the typical carrier tray.

Figure 2:
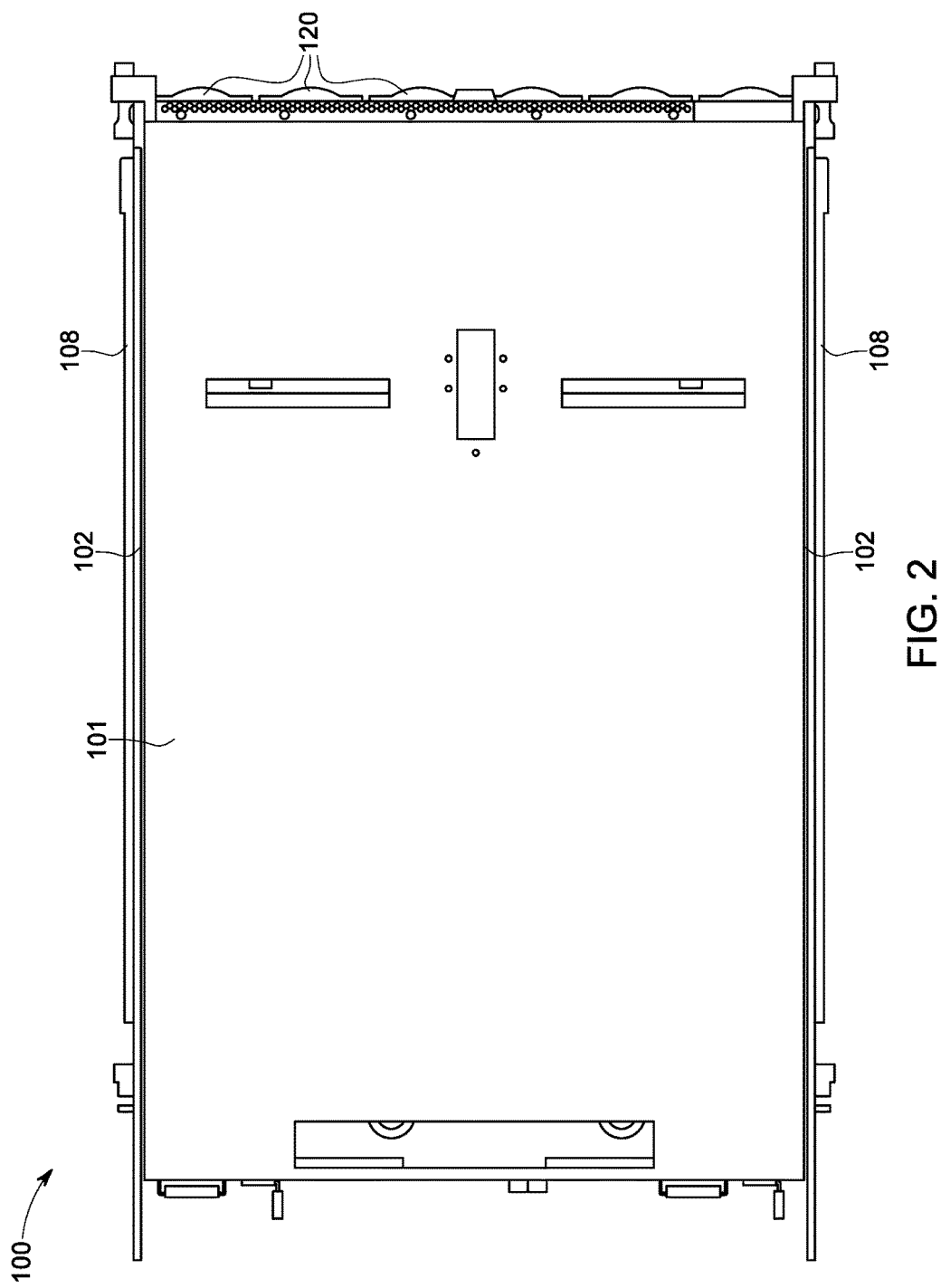
FIG. 2 illustrates a top view of the example high density chassis of FIG. 1.

FIG. 2 illustrates a top view of the example high density chassis 100 of FIG. 1. The chassis 100 is shown with a ceiling plate 101, two side walls 102, two side rails 108, and multiple carrier trays 120.

Figure 3:
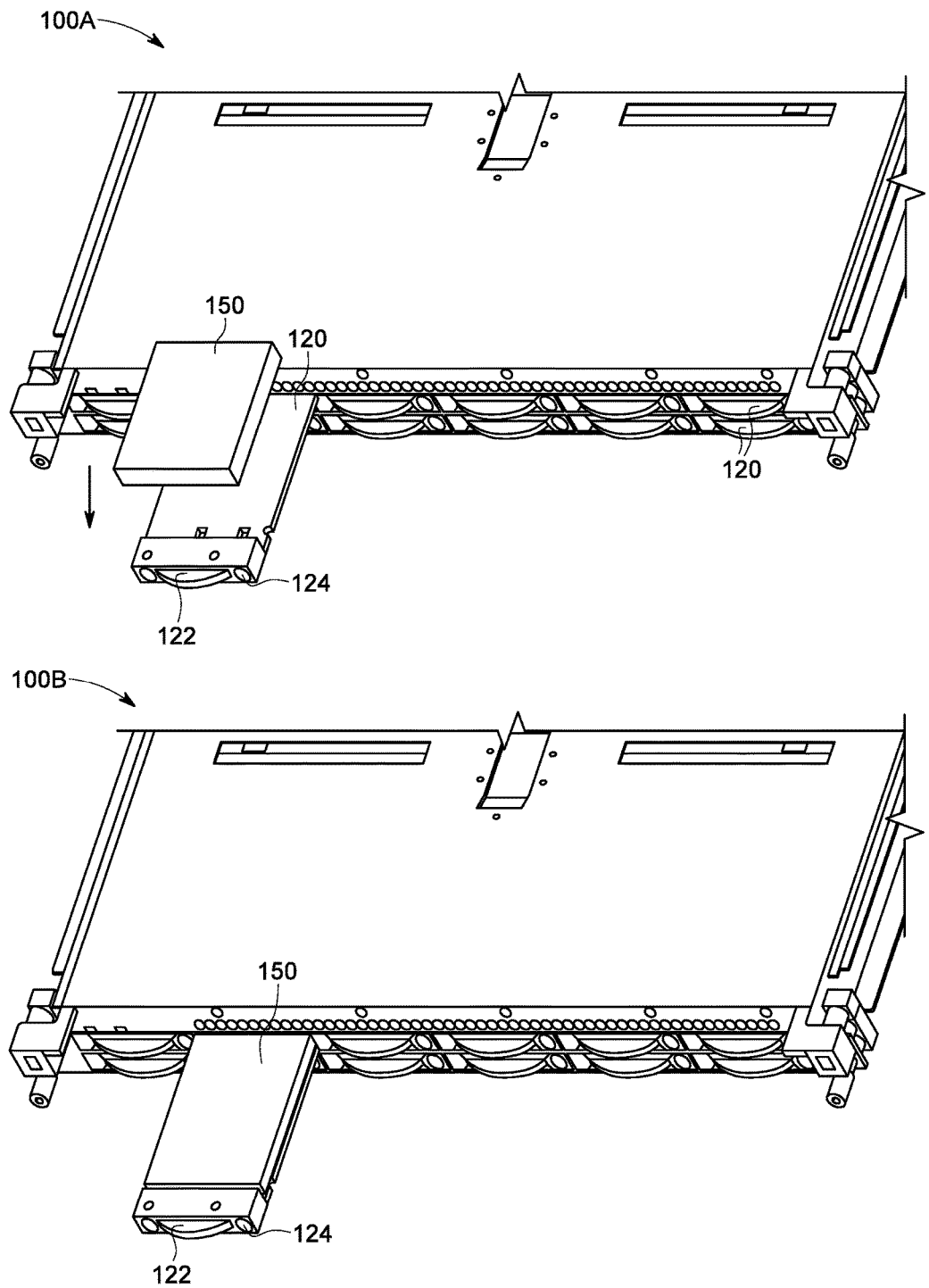
FIG. 3 illustrates a first perspective view of mounting an electronic device in the example high density chassis of FIG. 1.

FIG. 3 illustrates a first perspective view of mounting an electronic device in the example high density chassis 100 of FIG. 1. The chassis configuration 100A shows one carrier tray 120 of twelve carrier trays pulled out of the chassis 100 into an open position. The carrier tray 120 is configured to mount an electronic device 150. For example, the electronic device 150 can be a 2.5 inch width standard (e.g., between 60 millimeters and 66 millimeters wide) storage device such as a hard disk drive (HDD) or solid state drive (SSD). The carrier tray 120 includes a recess for the electronic device 150. In some implementations, the carrier tray 120 can include one or more additional recesses (not shown) to mount one or more corresponding additional electronic devices.

In some implementations, the carrier tray 120 includes a handle 122 to allow an administrator to easily pull the carrier tray 120 out of the compartment of the chassis 100. In some implementations, the carrier tray 120 includes a front panel 124 with connector ports for connecting to the electronic device 150 from front of the chassis 100.

The chassis configuration 100B shows the electronic device 150 fully inserted into the recess of the carrier tray 120. The carrier tray 120 can then be pushed back into the compartment of the chassis 100 to a closed position. Each of the other carrier trays 120 functions substantially similar to the carrier tray 120 in the open position shown.

Figure 4:
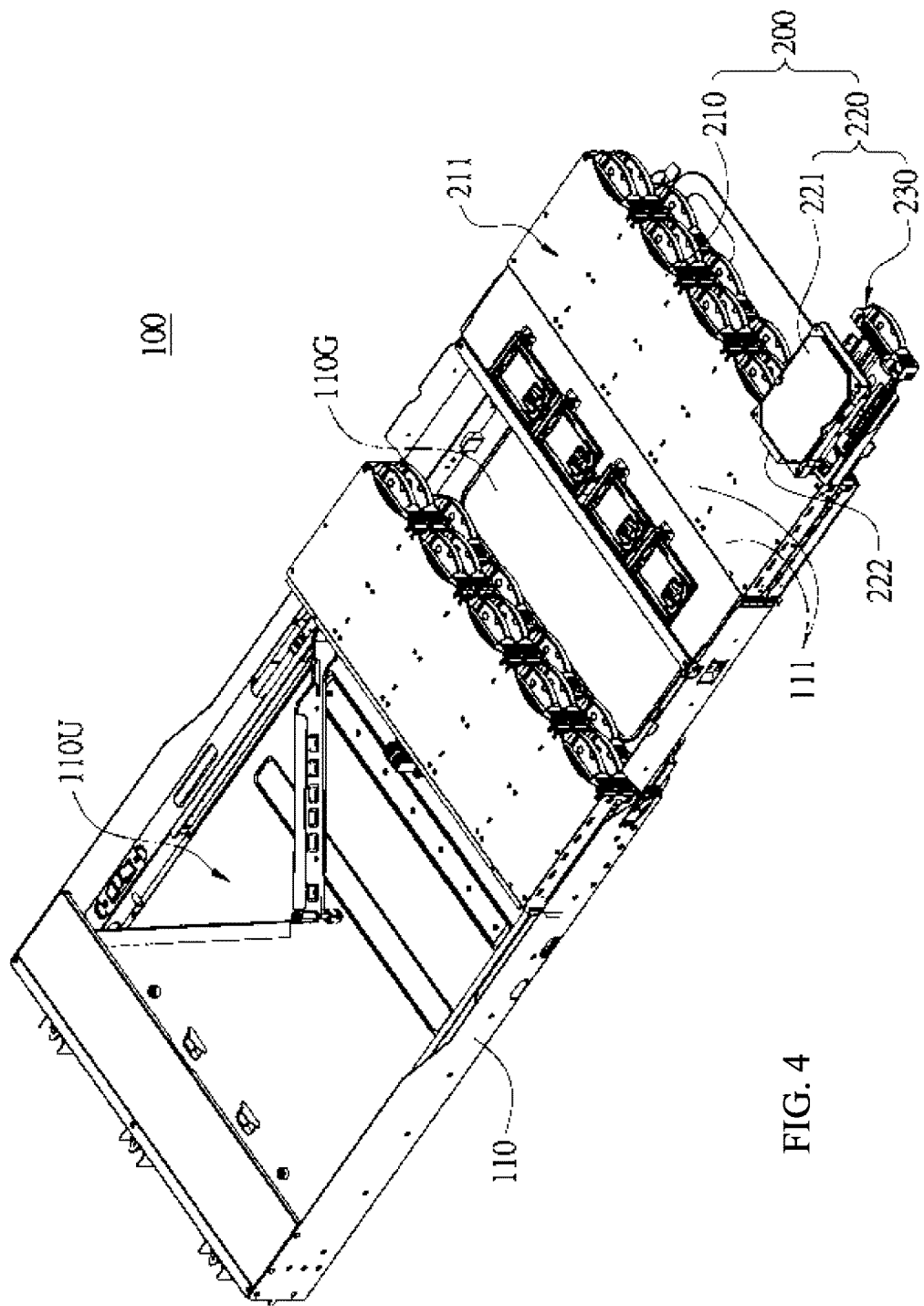
FIG. 4 is a schematic view showing the storage array module being installed in a server according to one embodiment of the present disclosure.

FIG. 4 illustrates an example method for mounting an electronic device in a server rack. At step 410, an administrator slides a carrier tray outward from a removable chassis of the server rack, to an open position, where the removable chassis includes: 1) two side walls on either side of the removable chassis, where each side wall comprises a slide rail for sliding the removable chassis into or out of the server rack, and 2) an accommodation space defined between the two sidewalls, the accommodation space divided into a plurality of compartments by a plurality of dividers.

At step 410, the administrator inserts the electronic device into a recess of the carrier tray, where the carrier tray is slidably attached to one of the plurality of compartments and held in place by friction.

At step 420, the administrator slides the carrier tray inward into the removable chassis, to a closed position.

Reference is now made to FIG. 4 in which FIG. 4 is a schematic view showing the storage array module 200 being installed in a server 100 according to one embodiment of the present disclosure. As shown in FIG. 4, the storage array module 200 includes a chassis 210 and a plurality of hard disk units 220. The chassis 210 is formed with an accommodation space 211 and a plurality of first connection ports 111 (e.g., connection terminals of a hard disk driver 221). The first connection port 111 is a tool-free connector arranged in the accommodation space 211. The hard disk units 220 are arranged in the accommodation space 211 with a cluster style, for example, the hard disk units 220 are stacked in the accommodation space 211 with a generalized array way, i.e., the line direction and the row direction of array can be perpendicular or not perpendicular to each other. Each of the hard disk units 220 includes a hard disk accommodating unit 230 and a hard disk driver 221. Each of the hard disk accommodating units 230 only allows single hard disk driver 221 to be accommodated. Each of the hard disk drivers 221 includes a second connection port 222 (e.g., connection terminals of the hard disk driver 221). The second connection port 222 is a tool-free connector which can be detachably coupled to one of the first connection ports 111. Because the hard disk driver 221 is a commonly seen hard disk product, a hard disk case is not provided, thereby defining the hard disk driver 221 as a naked disk driver.

Figure 5A:
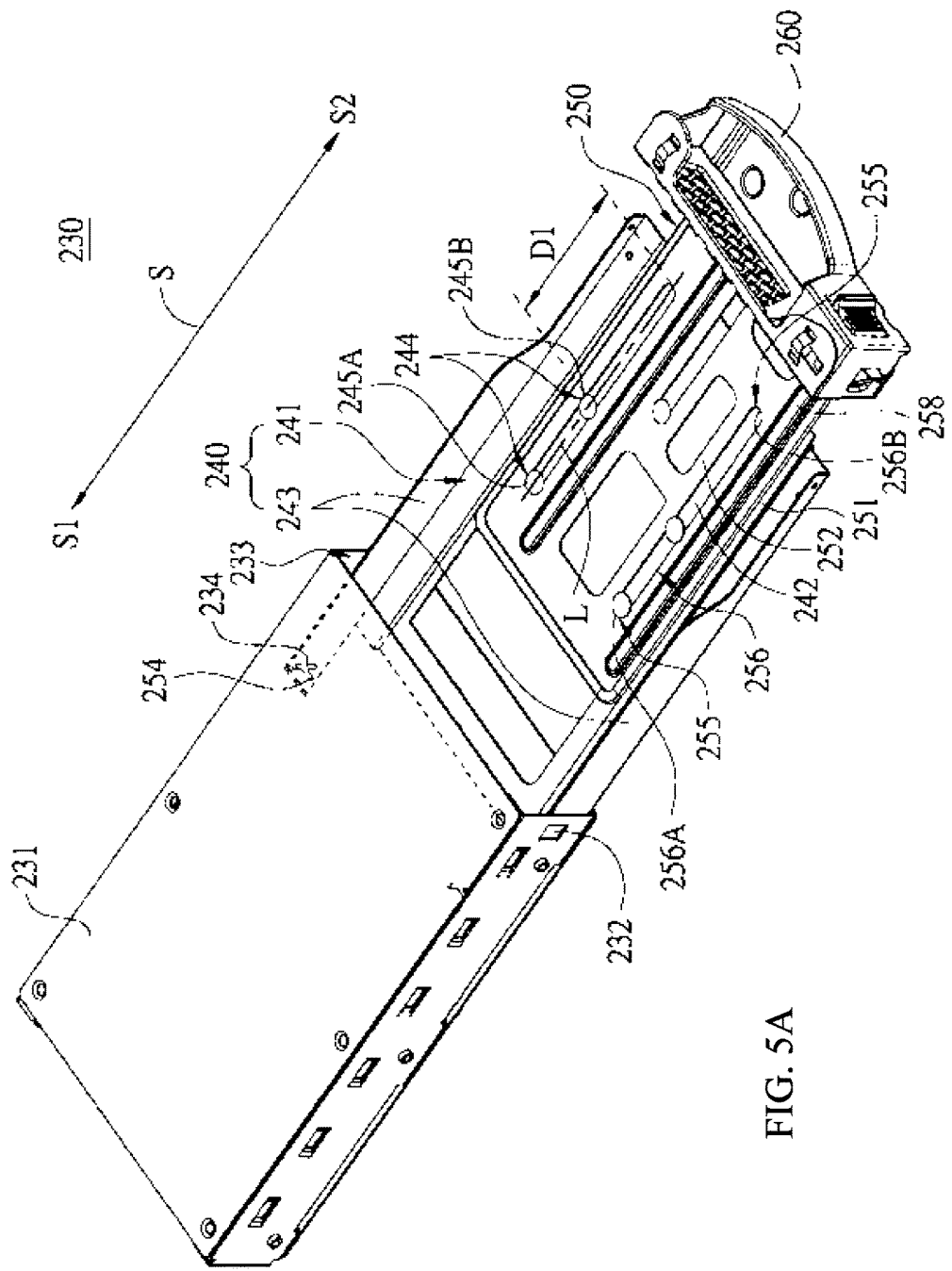
FIG. 5A is a schematic view illustrating the hard disk accommodating unit being in a first pulling out status according to one embodiment of the present disclosure.

FIG. 5A is a schematic view illustrating the hard disk accommodating unit 230 being in a first pulling out status according to one embodiment of the present disclosure. As shown in FIG. 4 and FIG. 5A, each of the hard disk accommodating units 230 includes a casing 231, a first tray 240 and a second tray 250. The casing 231 is formed with a fixing recess 233. The casing 231 is fastened (e.g., being locked) in the accommodation space 211 of the chassis 210 (as shown in FIG. 4). The first tray 240 is reciprocally and slidably disposed in the fixing recess 233, so the first tray 240 is able to reciprocally slide in or slide out of the fixing recess 233 in a sliding direction S. The first tray 240 is formed with two position-limiting parts 244 arranged with an interval. An imaginary line L defined between the two position-limiting parts 244 is parallel to the sliding direction S. The second tray 250 is reciprocally and slidably disposed on the first tray 240, and the second tray 250 can be restrained on the first tray 240, so the second tray 250 is able to reciprocally slide on the first tray 240 along the sliding direction S. The second tray 250 is formed with two push portions 255 arranged with an interval, the two push portions 255 are both on the imaginary line L, i.e., the imaginary line L passes both of the two push portions 255. Each of the hard disk drivers 211 is physically contacts with the second tray 250, but can be disposed on the first tray 240 and the second tray 250 at the same time.

According to this embodiment, the storage array module 200 is installed in a server 100, for example the storage array module 200 is slidably disposed in a machine case 110 of the server 110 thereby being able to be pushed into the machine case 110 or pulled out of the machine case 110, in more details, the storage array module 200 is slidably disposed in an upper layer zone 110U of the machine case 110, or the quantity of the storage array module 200 is two and a gap 110G is kept between the two.

However, the storage array module 200 provided by the present disclosure is not limited to be applied in the server 100 only.

Figure 5B:
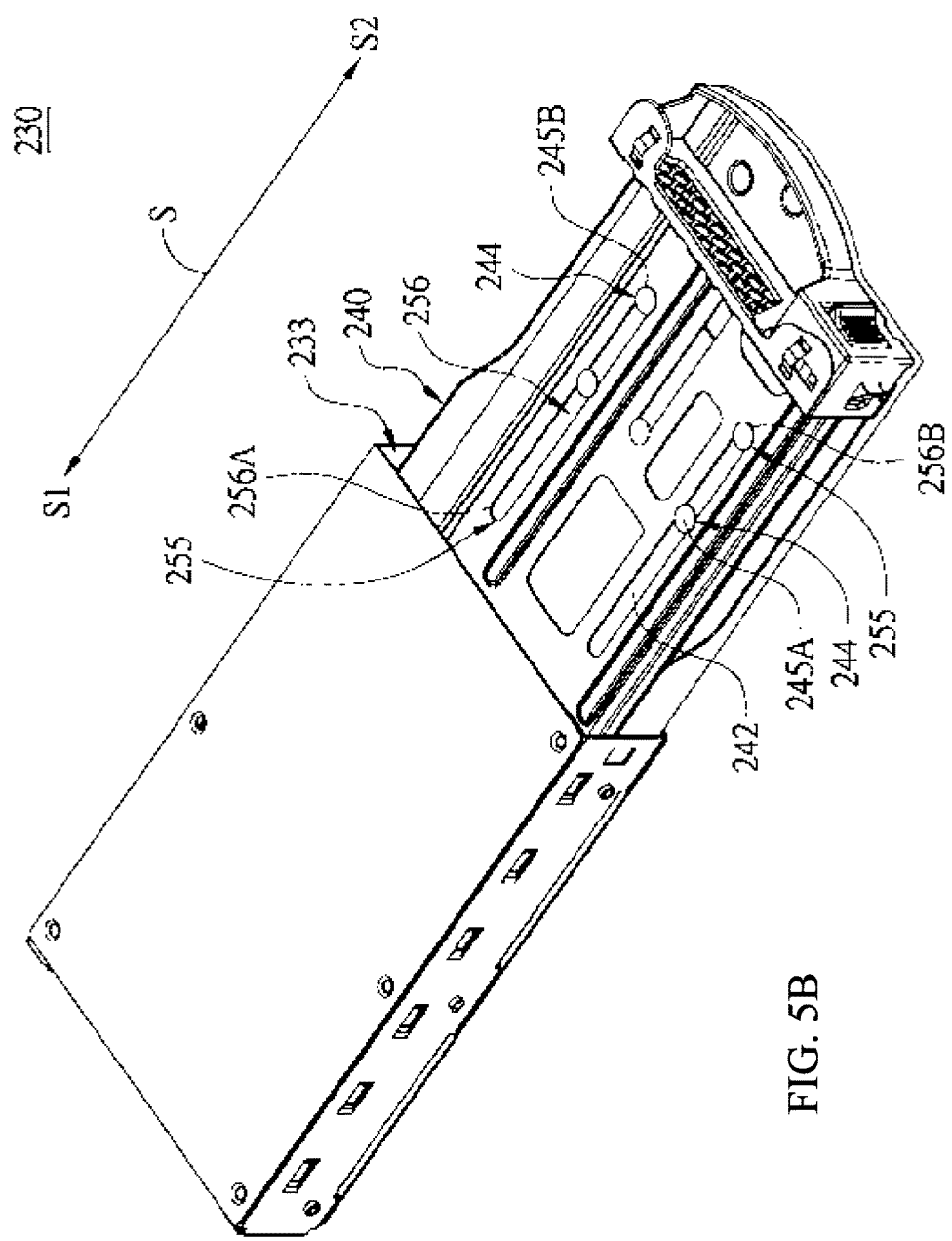
FIG. 5B is a schematic view illustrating the hard disk accommodating unit of FIG. 2A being in a second pulling out status.
Figure 5C:
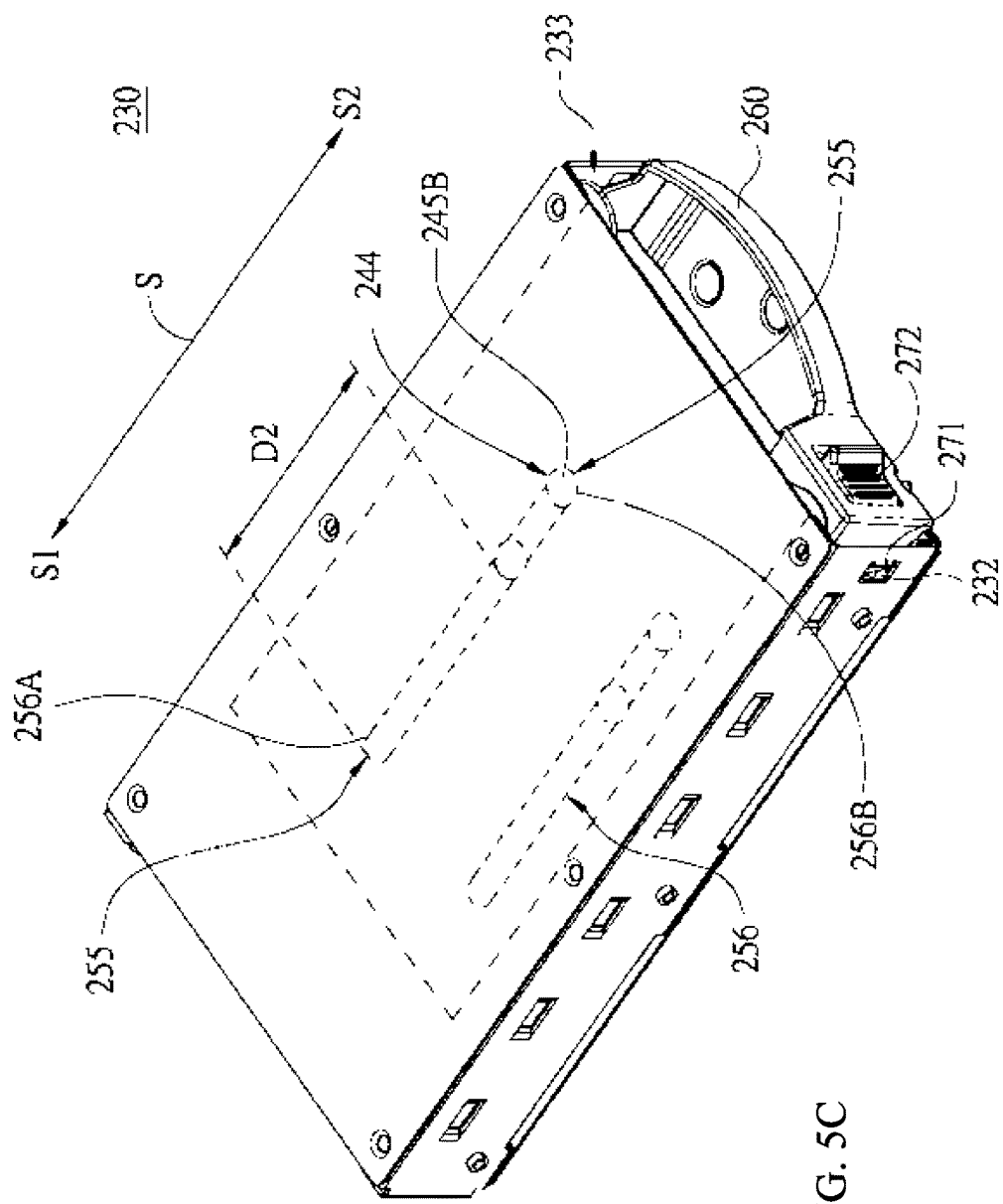
FIG. 5C is a schematic view illustrating the hard disk accommodating unit of FIG. 2A being in a returning status.

Reference is now made to FIG. 5B and FIG. 5C in which FIG. 5B is a schematic view illustrating the hard disk accommodating unit 230 of FIG. 5A being in a second pulling out status, and FIG. 5C is a schematic view illustrating the hard disk accommodating unit 230 of FIG. 5A being in a returning status.

As shown in FIG. 5A and FIG. 5B, the first tray 240 includes a bottom plate 241 and two lateral walls 243 formed at two opposite long sides of the bottom plate 241 and extended towards the same direction (e.g., upward). The bottom plate 241 is formed with a first convex column 245A, a second convex column 245B and a first carrying surface 242. The first carrying surface 242 is served to support the second tray 250 and the hard disk driver 221 (as shown in FIG. 4). The first convex column 245A and the second convex column 245B are protruded from the first carrying surface 242 and respectively acted as the two position-limiting parts 244. The first convex column 245A and the second convex column 245B are rivets, screws or other similar members.

The second tray 250 includes a tray body 251 and at least one linear opening 256. The tray body 251 is formed with a second carrying surface 252. The second carrying surface 252 is served to support and physically contact with the hard disk driver. The linear opening 256 is formed on the second carrying surface 252 of the tray body 251, and two opposite inner edges (defined as a first inner edge 256A and a second inner edge 256B) of the linear opening 256 are respectively served as the push portions 255. One end of the first convex column 245A and the second convex column 245B are both connected to the first carrying surface 242 of the first tray 240, the other end passes the linear opening 256, for example, as shown in FIG. 5A, the first convex column 245A and the second convex column 245B are e.g., round rivets which cover on the second carrying surface 252 after the other end protruding the linear opening 256.

As shown in FIG. 5A, a first pulling out status is defined as the maximum level of the second tray 250 being pulled out from the first tray 240 and the first inner edge 256A of the linear opening 256 being in contact with the first convex column 245A. The second tray 250 further includes a handle 260. The handle 260 is arranged at a distal end of the tray body 251 which is away from the first inner edge 256A thereby being permanently located outside the fixing recess 233, so a user can utilize the handle 260 to pull the second tray 250 out of the fixing recess 233.

What shall be addressed in that the first convex column 245A and the second convex column 245B of the first tray 240 and the linear opening 256 of the second tray 250 are not limited to be arranged on the first carrying surface 242 and the second carrying surface 252, the mentioned components can also be arranged on other adjacent lateral walls of the first tray 240 and the second tray 250. Moreover, the sliding means of the first tray 240 and the second tray 250 are not limited to certain types, the sliding means can be adopting as sliding rails, sliding wheels, sliding blocks or simply adopting the sliding of the tray itself.

Thus, when the second tray 250 shown in FIG. 5A slides a first distance D along a slide in direction S1 of the sliding direction S, the first distance D1 is defined as the distance between the second inner edge 256B and the second convex column 245B, the second tray 250 is completely disposed on the first carrying surface 242 of the first tray 240, and the second inner edge 256B of the linear opening 256 starts to be in contact with the second convex column 245B (as shown in FIG. 5B), thereby being defined as a second pulling out status. In the second pulling out status, the second inner edge 256B pushes the second convex column 245B, so the first tray 240 is enabled to slide along the slide in direction S1 of the sliding direction S, the second tray 250 and the first tray 240 are both pushed into the fixing recess 233 (as shown in FIG. 5C), thereby being defined as a returning status.

Figure 5D:
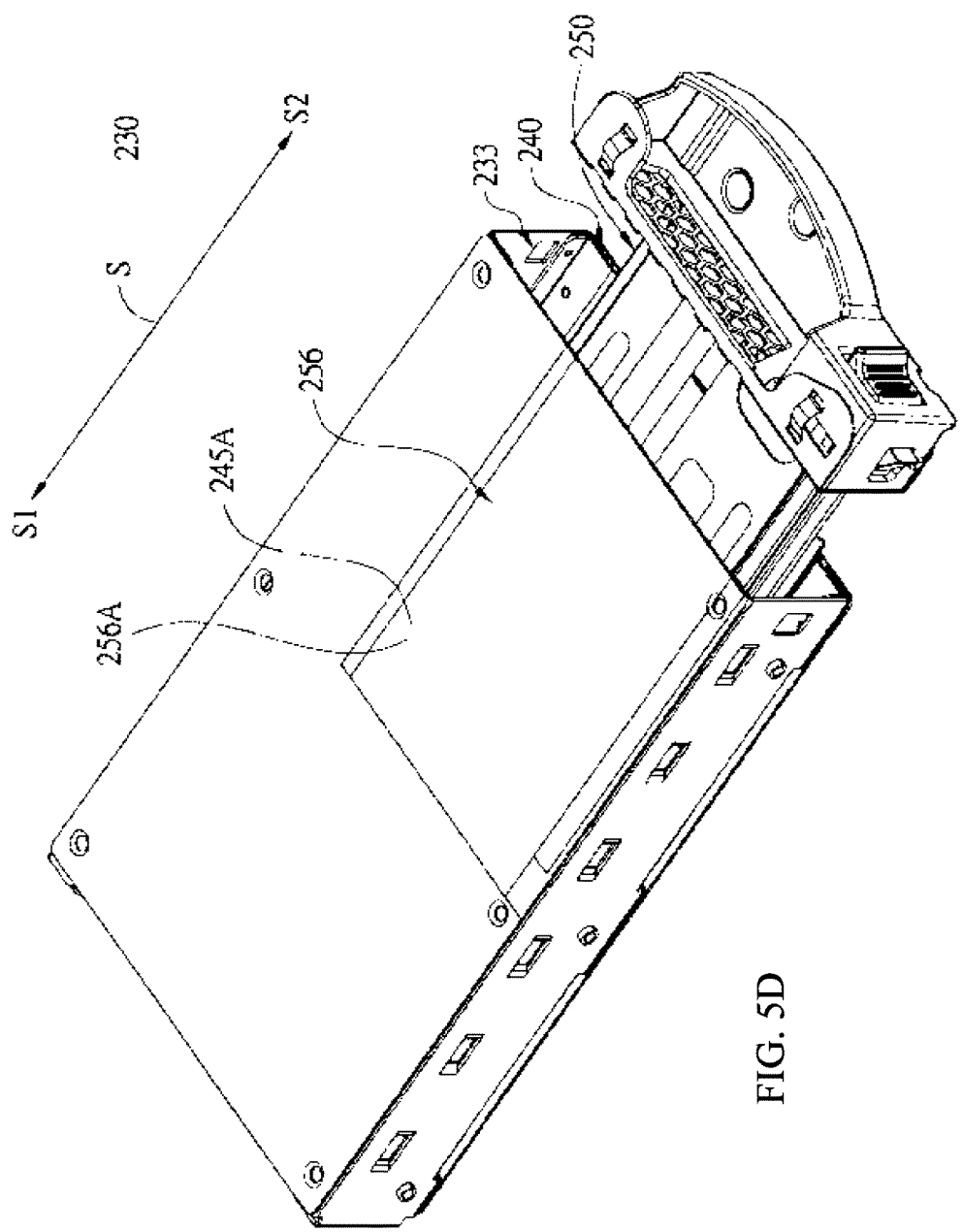
FIG. 5D is a schematic view illustrating the hard disk accommodating unit of FIG. 2A being in a third pulling out status.

FIG. 5D is a schematic view illustrating the hard disk accommodating unit 230 of FIG. 5A being in a third pulling out status. As shown in FIG. 5C and FIG. 5D, when the second tray 250 shown in FIG. 5C slides a second distance D2 along a slide out direction S2 of the sliding direction S, the first inner edge 256A of the linear opening 256 starts to be in contact with the first convex column 245A (as shown in FIG. 5D), the second distance D2 is defined as the distance between the first inner edge 256A and the first convex column 245A and is the same as the first distance D1, so the current status is defined as a third pulling out status. In the third pulling out status, the first inner edge 256A pushes the first convex column 245A, the first tray 240 is enabled to slide along the slide out direction S2 of the sliding direction S, so the second tray 250 and the first tray 240 are both pulled out of the fixing recess 233 (as shown in FIG. 5A) thereby returning to the first pulling out status.

Thus, when the hard disk driver 221 (shown in FIG. 4) is placed on the second carrying surface 252 of the second tray 250, and the hard disk accommodating unit 230 enters the returning status after being in the first pulling out status and the second pulling out status, the second connection port 222 of the hard disk driver 221 can be inserted in the first connection port 111 for exchanging data and receiving power supply.

Figure 6A:
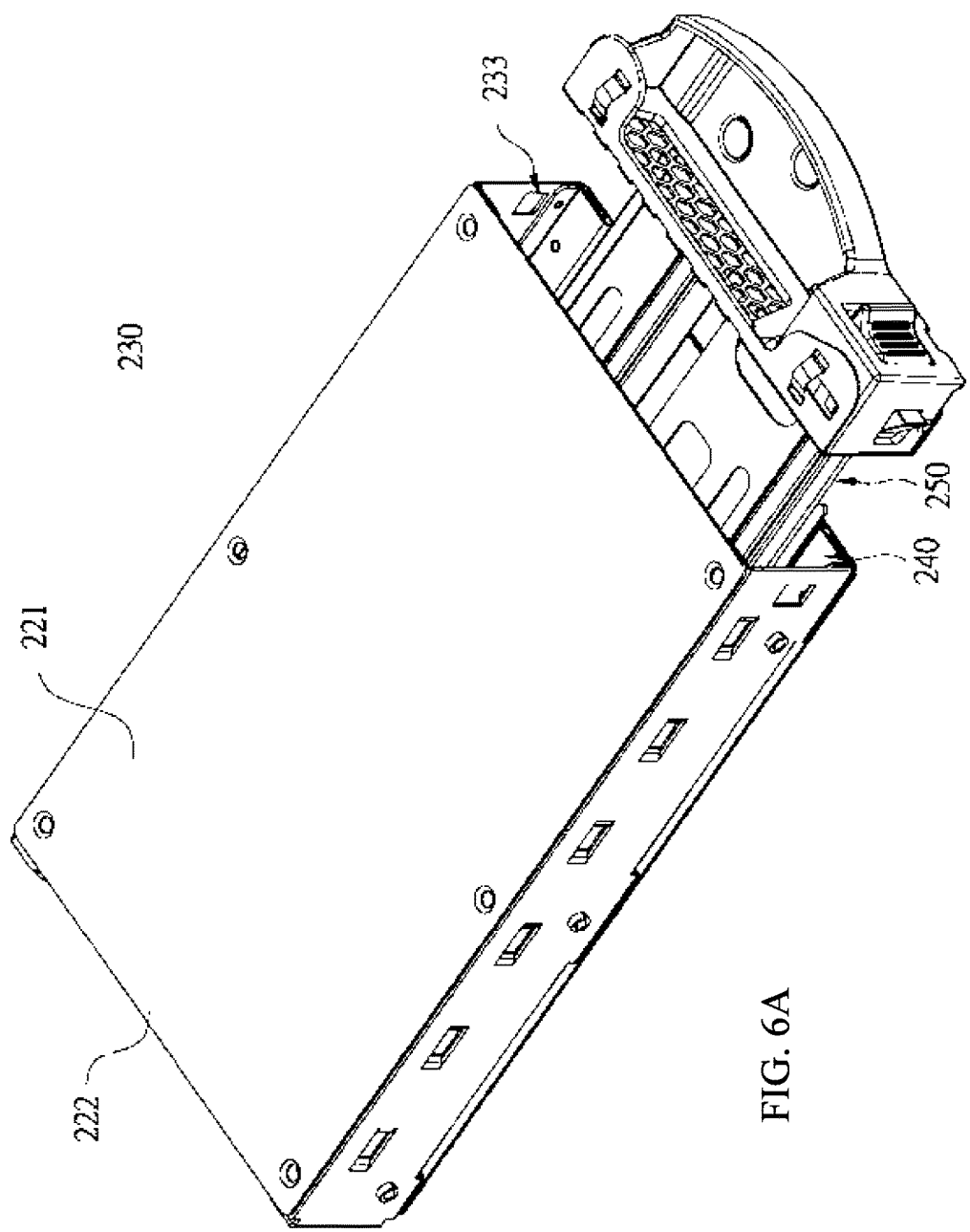
FIG. 6A is a flowchart showing a hard disk driver being taken out from the hard disk accommodating unit.
Figure 6B:
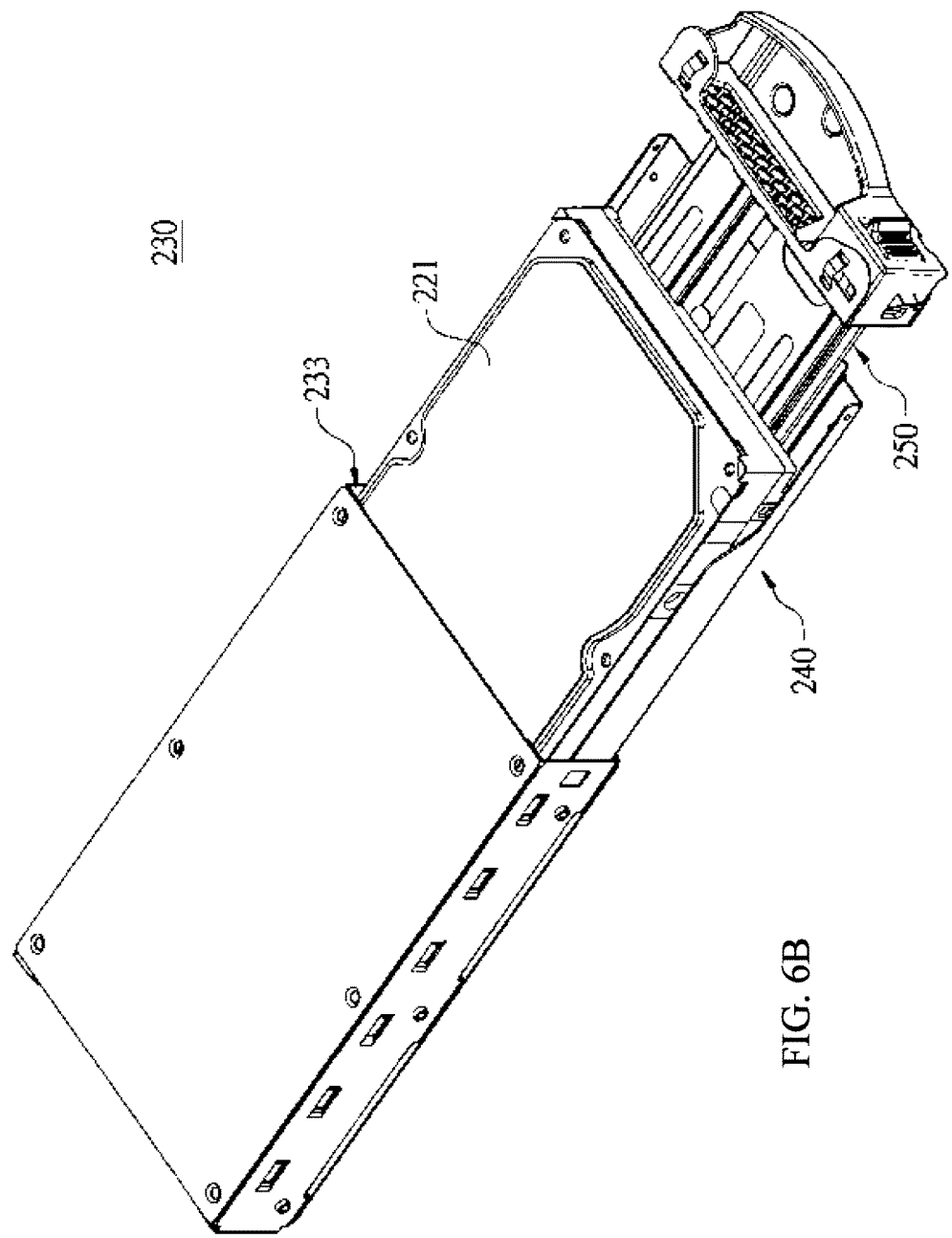
FIG. 6B is another flowchart showing a hard disk driver being taken out from the hard disk accommodating unit.

FIG. 6A is a flowchart showing a hard disk driver 221 being taken out from the hard disk accommodating unit 230, and FIG. 6B is another flowchart showing a hard disk driver 221 being taken out from the hard disk accommodating unit 230.

When the hard disk accommodating unit 230 is operated for entering the first pulling out status (as shown in FIG. 6B) from the returning status and the third pulling out status (as shown in FIG. 6A), the second connection port 222 of the hard disk driver 221 is released from the first connection port 111 (as shown in FIG. 4), so the hard disk driver 221 is no longer fastened by any other structure. Accordingly, the user can take out the hard disk driver 221 thereby achieving the objective of removing or replacing the hard disk driver 221.

However, the position-limiting part of the first tray 240 and the push part of the second tray 250 are not limited to the disclosure, the position-limiting part of the first tray 240 and the push part of the second tray 250 can also be alternated as followings.

Figure 7A:
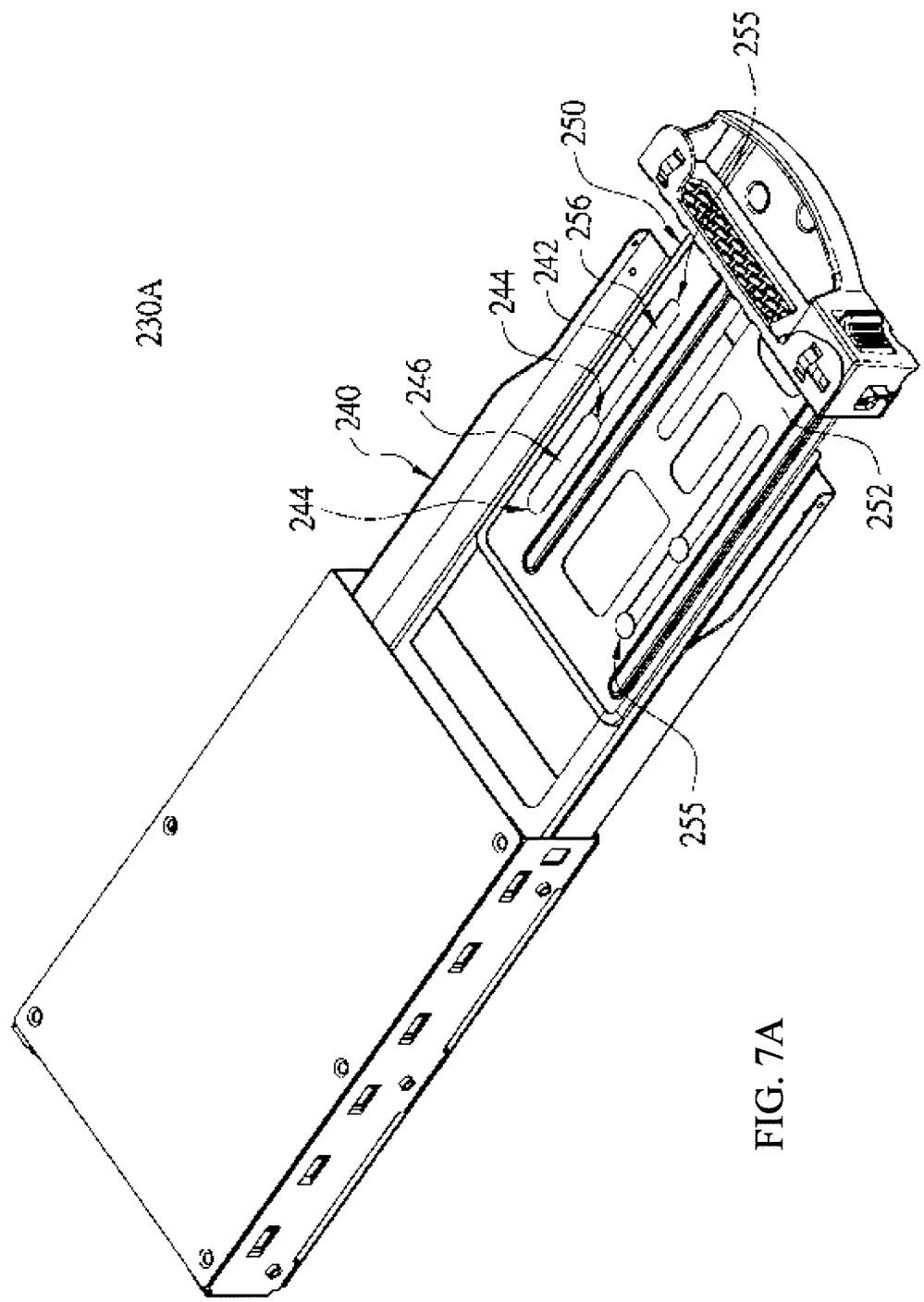
FIG. 7A is a perspective view showing the hard disk accommodating unit according to another embodiment of the present disclosure.

FIG. 7A is a perspective view showing the hard disk accommodating unit 230A according to another embodiment of the present disclosure. According to another embodiment disclosed in FIG. 7A, the structure of the second tray 250 is the same as the structure disclosed in FIG. 5A, therefore no further illustration is provided. However, the first tray 240 further includes a linear flange 246 protruded on the first carrying surface 242 of the first tray 240 and extended from the first carrying surface 242 of the first tray 240 into the linear opening 256, so two opposite ends of the linear flange 246 can be respectively served as the position-limiting part 244, two opposite inner edges of the linear opening 256 can be respectively served as the push part 255.

However, the linear flange 246 of the first tray 240 and the linear opening 256 of the second tray 250 are not limited to be arranged on the first carrying surface 242 and the second carrying surface 252, the mentioned components can also be arranged on other adjacent lateral walls of the first tray 240 and the second tray 250.

Figure 7B:
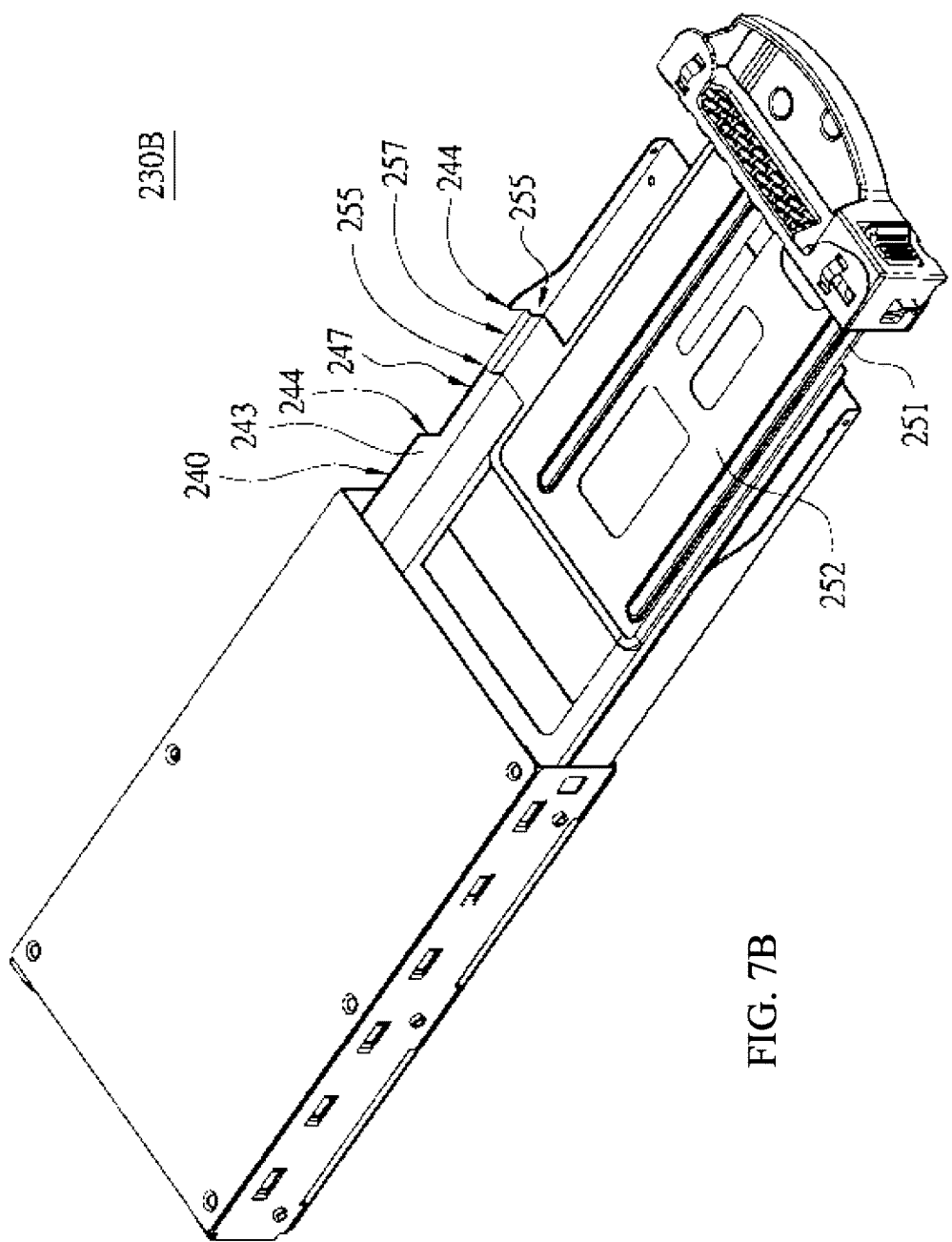
FIG. 7B is a perspective view showing the hard disk accommodating unit according to one another embodiment of the present disclosure.

FIG. 7B is a perspective view showing the hard disk accommodating unit 230B according to one another embodiment of the present disclosure. As shown in FIG. 7B, the structure of the first tray 240 is similar to the structure disclosed in FIG. 5A, the difference is that the first tray 240 further includes a linear notch 247 formed on the mentioned lateral wall 243. The structure of the second tray 250 is similar to the structure disclosed in FIG. 5A, the difference is that the second tray 250 further includes an extending fin 257. The extending fin 257 is extended from the second carrying surface 252 of the tray body 251 to the lateral wall 243 of the first tray 240, and slidably engaged on the linear notch 247. Thus, two opposite outer edges of the extending fin 257 can be respectively served as the push part 255, two opposite inner edges of the linear notch 247 can be respectively served as the position-limiting part 244.

However, the linear notch 247 of the first tray 240 and the extending fin 257 of the second tray 250 are not limited to be arranged on the lateral wall 243, the mentioned components can also be arranged on the first carrying surface 242.

Figure 8:
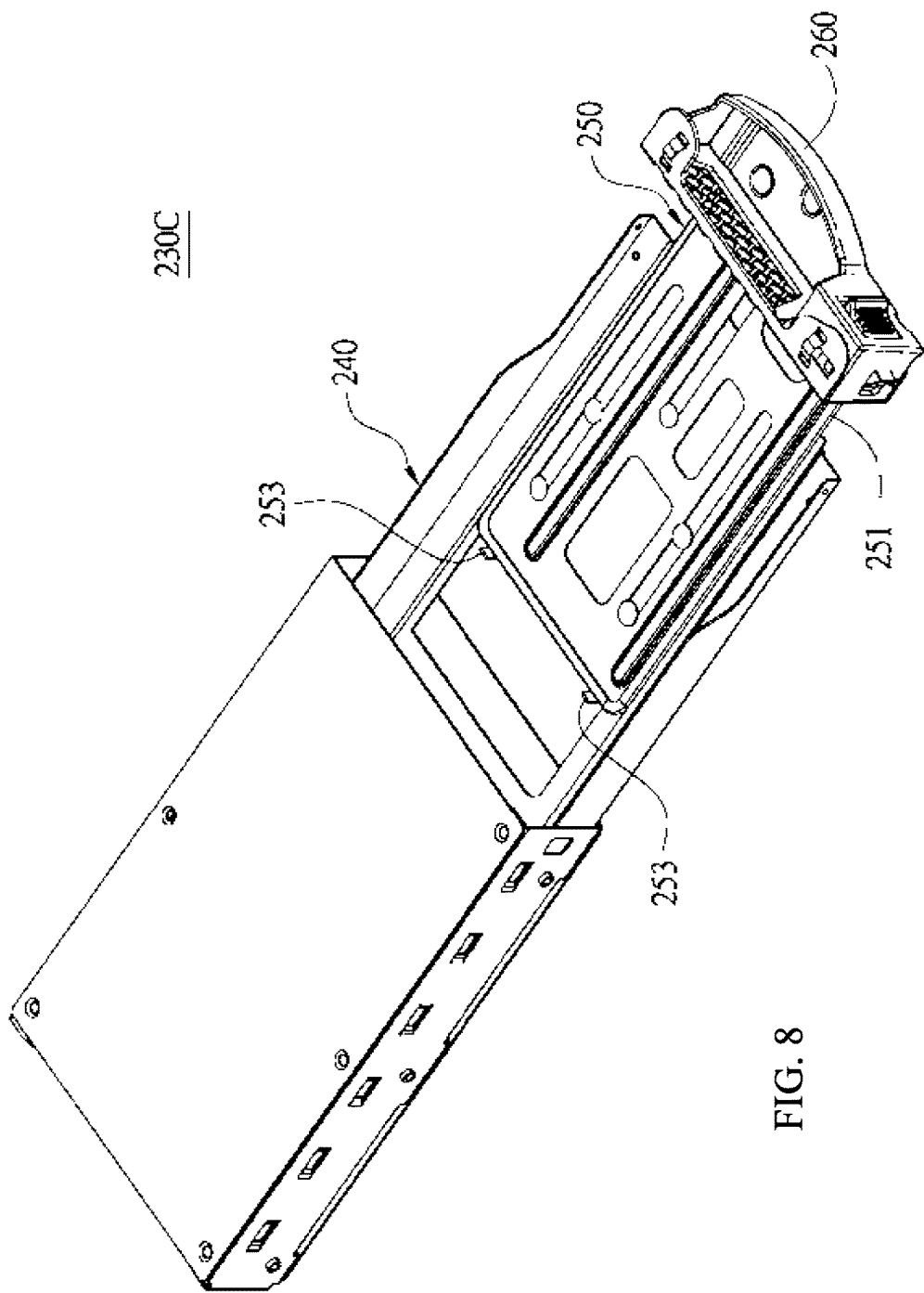
FIG. 8 is a perspective view showing the hard disk accommodating unit according to still one embodiment of the present disclosure.

FIG. 8 is a perspective view showing the hard disk accommodating unit 230C according to still one embodiment of the present disclosure. As shown in FIG. 4 and FIG. 8, the second tray 250 further includes two blocks 253 arranged at the other distal end of the tray body 251 opposite to the handle 260 and upwardly protrude. Thus, when a hard disk accommodating unit 230C is operated to the third pulling out status from the returning status (as shown in FIG. 6A), i.e., before the first tray 240 of the hard disk accommodating unit 230C is pushed, the second tray 250 drives the blocks 253 to push the hard disk driver 221 (show in FIG. 4), the second connection port 222 of the hard disk driver 221 is forced to be released from the first connection port 111, thereby preventing the second connection port 222 of the hard disk driver 221 from not being able to protrude from the fixing recess 233 with the second tray 250 due to over tight connection with the first connection port 111.

As shown in FIG. 5A, the second tray 250 further includes plural linear protrusions 258. The linear protrusions 258 are parallel to each other and arranged on the second carrying surface 252 for being physically contacted and supporting the hard disk driver. In addition, the linear protrusions 258 are in line contact with the hard disk driver thereby lowering the friction between the hard disk driver and the second tray 250.

The previous description of the disclosure is provided to enable any person skilled in the art to make or use the disclosure. Various modifications to the disclosure will be readily apparent to those skilled in the art, and the generic principles defined herein can be applied to other variations without departing from the scope of the disclosure. Thus, the disclosure is not intended to be limited to the examples and designs described herein, but is to be accorded the widest scope consistent with the principles and novel features disclosed herein.

The invention claimed is:

1. A removable chassis for a server rack, comprising:
    two side walls on either side of the removable chassis, each side wall comprises a slide rail for sliding the removable chassis into or out of the server rack;
    an accommodation space defined between the two sidewalls, the accommodation space divided into at least twelve compartments split into two rows by a plurality of dividers and a horizontal divider, each of the at least twelve compartments being substantially equivalent in dimensions; and
    a carrier tray, slidably attached to a corresponding compartment, the corresponding compartment defined by four walls, the carrier tray comprising a bottom plate and two lateral walls formed at two opposite long sides of the bottom plate and extended towards the same direction, the bottom plate formed with at least two position-limiting parts arranged with an interval, an imaginary line between the at least two position-limiting parts being parallel to a sliding direction of the carrier tray, wherein, when the carrier tray slides into the corresponding compartment, the carrier tray is held in place by the at least two position-limiting parts, and wherein the corresponding compartment does not have any side rail, the carrier tray comprising at least one recess for each removably receiving an electronic device.

2. The system of claim 1, wherein the carrier tray further comprises:
    a handle for pulling the carrier tray out of the compartment; and a front panel including connectors for the electronic device.

3. The system of claim 1, wherein the plurality of dividers comprise five vertical b dividers and a horizontal divider for dividing the accommodation space into twelve compartments.

4. The system of claim 1, wherein each of the plurality of compartments is substantially equivalent in dimensions.

5. The system of claim 1, wherein the removable chassis is between 423 millimeters and 453 millimeters wide.

6. The system of claim 1, wherein the removable chassis is between 42 millimeters and 46 millimeters in height.

7. The system of claim 1, wherein the electronic device is between 60 millimeters and 66 millimeters wide.

8. A method for mounting an electronic device in a server rack, comprising:
 sliding a carrier tray outward from a removable chassis of the server rack, to an open position, further comprises:
  two side walls on either side of the removable chassis, wherein each side wall comprises a slide rail for sliding the removable chassis into or out of the server rack; and
  an accommodation space defined between the two sidewalls, the accommodation space divided into at least twelve compartments split into two rows by a plurality of dividers and a horizontal divider, each of the at least twelve compartments being substantially equivalent in dimensions;
 inserting the electronic device into a corresponding compartment of the carrier tray, the corresponding compartment defined by four walls, the carrier tray comprising a bottom plate and two lateral walls formed at two opposite long sides of the bottom plate and extended towards the same direction, the bottom plate formed with at least two position-limiting parts arranged with an interval, an imaginary line between the at least two position-limiting parts being parallel to a sliding direction of the carrier tray, wherein, when the carrier tray slides into the corresponding compartment, the carrier tray is held in place by the at least two position-limiting parts, wherein the corresponding compartment does not have any side rail; and
 sliding the carrier tray inward into the removable chassis, to a closed position.

9. The system of claim 8, wherein the carrier tray comprises:
 a handle for pulling the carrier tray out of the compartment; and
 a front panel including connectors for the electronic device.

10. The system of claim 8, wherein the plurality of dividers comprise five vertical dividers and a horizontal divider for dividing the accommodation space into twelve compartment.

11. The system of claim 8, wherein each of the plurality of compartments is substantially equivalent in dimensions.

12. The system of claim 8, wherein the removable chassis is between 423 millimeters and 453 millimeters wide.

13. The system of claim 8, wherein the removable chassis is between 42 millimeters and 46 millimeters in height.

14. The system of claim 8, wherein the electronic device is between 60 millimeters and 66 millimeters wide.

15. The system of claim 1, wherein the removable chassis is a 1U chassis.

16. The system of claim 15, wherein a width of the carrier tray is substantially the same as a width of the corresponding compartment such that the width of the carrier tray is capable of fitting six 2.5 inches storage devices, five dividers, and two side walls.

17. The system of claim 16, wherein a height of the carrier try is substantially the same as a height of the corresponding compartment such that the height of the carrier tray is capable of fitting two rows of six 2.5 inches storage devices, and the horizontal divider.

\* \* \* \* \*